(12) United States Patent
Franz et al.

(10) Patent No.: US 11,199,192 B1
(45) Date of Patent: Dec. 14, 2021

(54) PUMP ASSEMBLY HAVING PERFORMANCE ENHANCING HOSE CONNECTION PORTS

(71) Applicant: HEWLETT PACKARD ENTERPRISE DEVELOPMENT LP, Houston, TX (US)

(72) Inventors: John Franz, Houston, TX (US); Tahir Cader, Liberty Lake, WA (US); Ernesto Ferrer Medina, Aguadilla, PR (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/943,069

(22) Filed: Jul. 30, 2020

(51) Int. Cl.
| | |
|---|---|
| *F04D 25/00* | (2006.01) |
| *F04D 25/06* | (2006.01) |
| *G06F 1/20* | (2006.01) |
| *F04D 29/52* | (2006.01) |
| *F04D 19/00* | (2006.01) |
| *H05K 7/20* | (2006.01) |

(52) U.S. Cl.
CPC ....... *F04D 25/0606* (2013.01); *F04D 19/002* (2013.01); *F04D 29/522* (2013.01); *G06F 1/20* (2013.01); *H05K 7/20272* (2013.01)

(58) Field of Classification Search
None
See application file for complete search history.

(56) References Cited

U.S. PATENT DOCUMENTS

| | | | | |
|---|---|---|---|---|
| 2004/0245866 | A1* | 12/2004 | Lopatinsky | H01L 23/467 310/64 |
| 2006/0051222 | A1* | 3/2006 | Lee | F04D 13/064 417/423.14 |
| 2007/0000268 | A1* | 1/2007 | Crocker | H01L 23/473 62/259.2 |
| 2007/0227472 | A1* | 10/2007 | Takeuchi | F02G 5/00 123/41.19 |
| 2011/0309699 | A1* | 12/2011 | Woolmer | H02K 3/24 310/58 |
| 2013/0257055 | A1* | 10/2013 | Simpson | F03D 3/00 290/52 |
| 2020/0343801 | A1* | 10/2020 | Gerard | F03B 13/00 |
| 2021/0025397 | A1* | 1/2021 | Wu | F04D 13/14 |

* cited by examiner

*Primary Examiner* — Courtney L Smith
(74) *Attorney, Agent, or Firm* — Hewlett Packard Enterprise Patent Department

(57) ABSTRACT

Example implementations relate to a method and system for pumping fluid with a pump assembly to cool waste-heat producing system of an apparatus. The pump assembly includes a first housing, a rotor assembly, a stator assembly, a second housing, an outlet connection port coupled to the second housing, and a guide vane insert. The first housing includes a first bore and first inlet guide vanes (IGVs) coupled to inlet of the first bore. The rotor assembly including an impeller, is disposed in the first bore. The stator assembly including a coil, is mounted around a portion of the first housing. The second housing has a second bore fluidically coupled to the first bore, and first outlet guide vanes (OGVs) coupled at an entrance of the second bore. The guide vane insert including second OGVs, is disposed within the outlet connection port and fluidically coupled to outlet of the second bore.

20 Claims, 12 Drawing Sheets

PUMP ASSEMBLY HAVING PERFORMANCE ENHANCING HOSE CONNECTION PORTS

BACKGROUND

An apparatus, such as a rack of servers or a server mounted in the rack, may include a waste-heat producing system, for example, a processor-based system, which may generate a considerable amount of waste heat, thus causing electronic devices of the processor-based system to exceed their thermal specifications, if the waste heat is not adequately removed. One way of removing the waste heat is through the use of an air-based cooling system, in which one or multiple fans direct forced air across the heated electronic devices and their associated heat sinks. Another way of removing the waste heat is through the use of a liquid-based cooling system, in which a liquid coolant is circulated near the heated electronic devices and their heat sinks, and the liquid coolant is further circulated through one or multiple heat exchangers to remove the waste heat absorbed from the liquid coolant. Generally, pumps, such as a centrifugal pump or an axial pump, may be used in the liquid-based cooling systems to pump or circulate the liquid coolant. It is desirable for the pumps to provide high flow and high pressure in such environments, yet have a small footprint and overall volume to minimise take-up of available space in crowded servers, or other apparatuses, such as a hybrid electric vehicle, for example, where the space is at a premium.

BRIEF DESCRIPTION OF THE DRAWINGS

Various examples will be described below with reference to the following figures.

DETAILED DESCRIPTION

Figure 1:
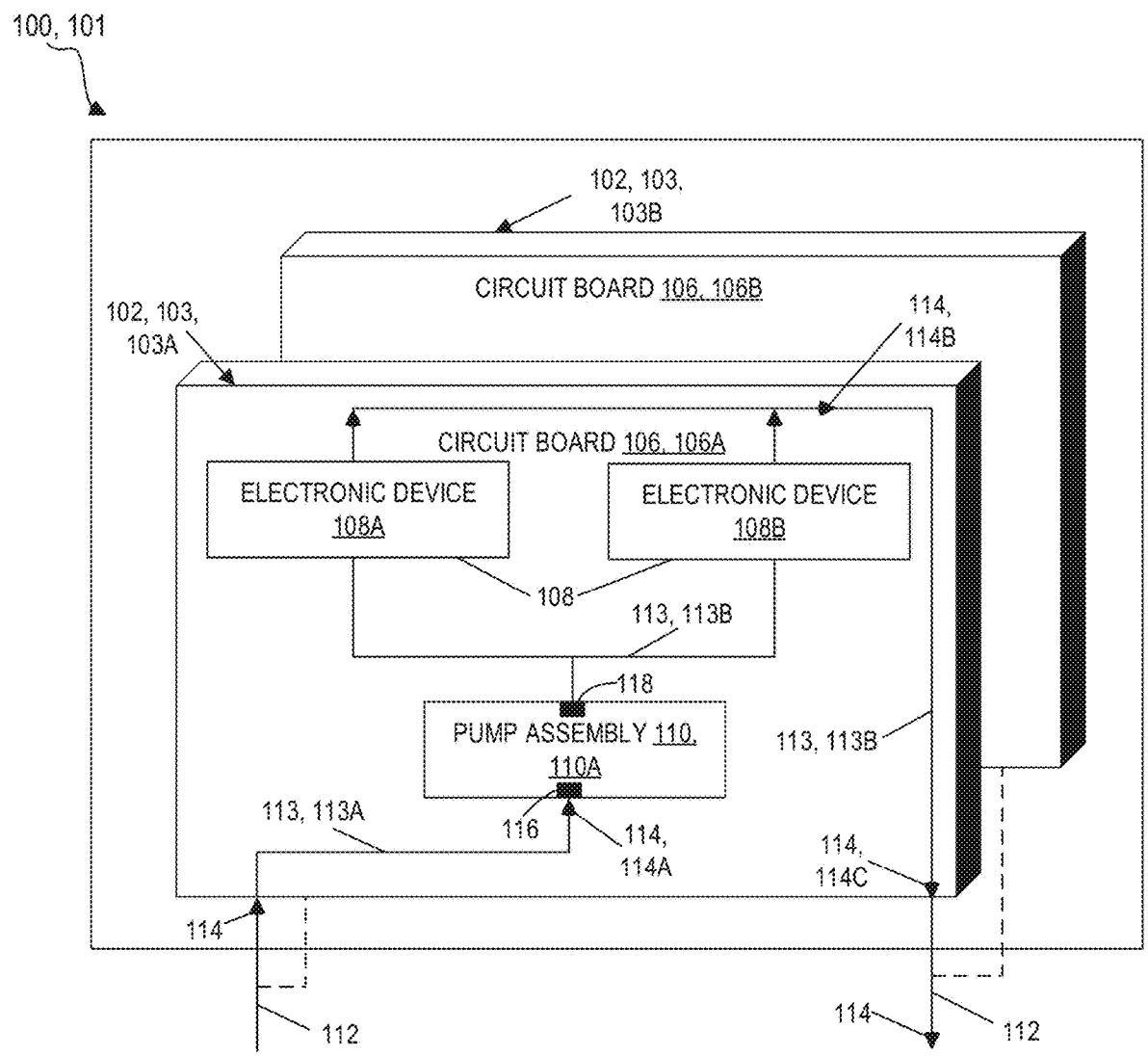
FIG. 1 illustrates a block diagram of an apparatus having a plurality of waste-heat producing systems and at least one pump assembly according to an example implementation of the present disclosure.

The following detailed description refers to the accompanying drawings. Wherever possible, the same reference numbers are used in the drawings and the following description to refer to the same or similar parts. It is to be expressly understood, however, that the drawings are for the purpose of illustration and description only. While several examples are described in this document, modifications, adaptations, and other implementations are possible. Accordingly, the following detailed description does not limit the disclosed examples. Instead, the proper scope of the disclosed examples may be defined by the appended claims.

The terminology used herein is for the purpose of describing example embodiments only and is not intended to be limiting. As used herein, the singular forms "a," "an," and "the" are intended to include the plural forms as well, unless the context clearly indicates otherwise. The term "plurality," as used herein, is defined as two, or more than two. The term "another," as used herein, is defined as at least a second or more. The term "coupled," as used herein, is defined as connected, whether directly without any intervening elements or indirectly with at least one intervening elements, unless otherwise indicated. Two elements may be coupled mechanically, electrically, or communicatively linked through a communication channel, pathway, network, or system. The term "and/or" as used herein refers to and encompasses any and all possible combinations of one or more of the associated listed items. It will also be understood that, although the terms first, second, third, etc. may be used herein to describe various elements, these elements should not be limited by these terms, as these terms are only used to distinguish one element from another unless stated otherwise or the context indicates otherwise. As used herein, the term "includes" means includes but not limited to, the term "including" means including but not limited to. The term "based on" means based at least in part on.

The present disclosure describes example implementations of a pump assembly and a method of pumping a cooling fluid using the pump assembly, for cooling a waste-heat producing system of an apparatus. In some examples, the apparatus is a rack of servers or a server mounted in the rack, and the waste-heat producing system is a processor-based system having one or more electronic devices disposed on a circuit board, for example, a mother board of the processor-based system. In some other examples, the apparatus may be a hybrid electric vehicle and the waste-heat producing system may be a battery pack. It may be noted herein that the pump assembly of the present disclosure may also be used for pumping fluid, which may be used for a non-waste heat producing system, without deviating from the scope of the present disclosure. For example, the non-waste heat producing system may a chemical processing system, a water irrigation system, and the like.

In one or more examples, the pump assembly may be a centrifugal pump assembly or an axial flow pump assembly, without deviating from the scope of the present disclosure. In such examples, the pump assembly may include a hose connection port, such as an inlet hose barb and/or an outlet hose barb having a plurality of guide vanes to regulate swirling of a flow of the cooling fluid (i.e., an inlet cooling fluid and an outlet cooling fluid), thereby assisting the pump assembly to increase the flow of the cooling fluid at a substantially high pressure. The plurality of guide vanes may be disposed within the hose connection port, thus allowing the pump assembly to occupy less space within the waste-heat producing system, and have a small footprint in the apparatus, while simultaneously improving the fluid pumping efficiency or performance of the pump assembly. In some examples, the cooling fluid is a liquid and the pump assembly is a liquid pump.

Figure 5:
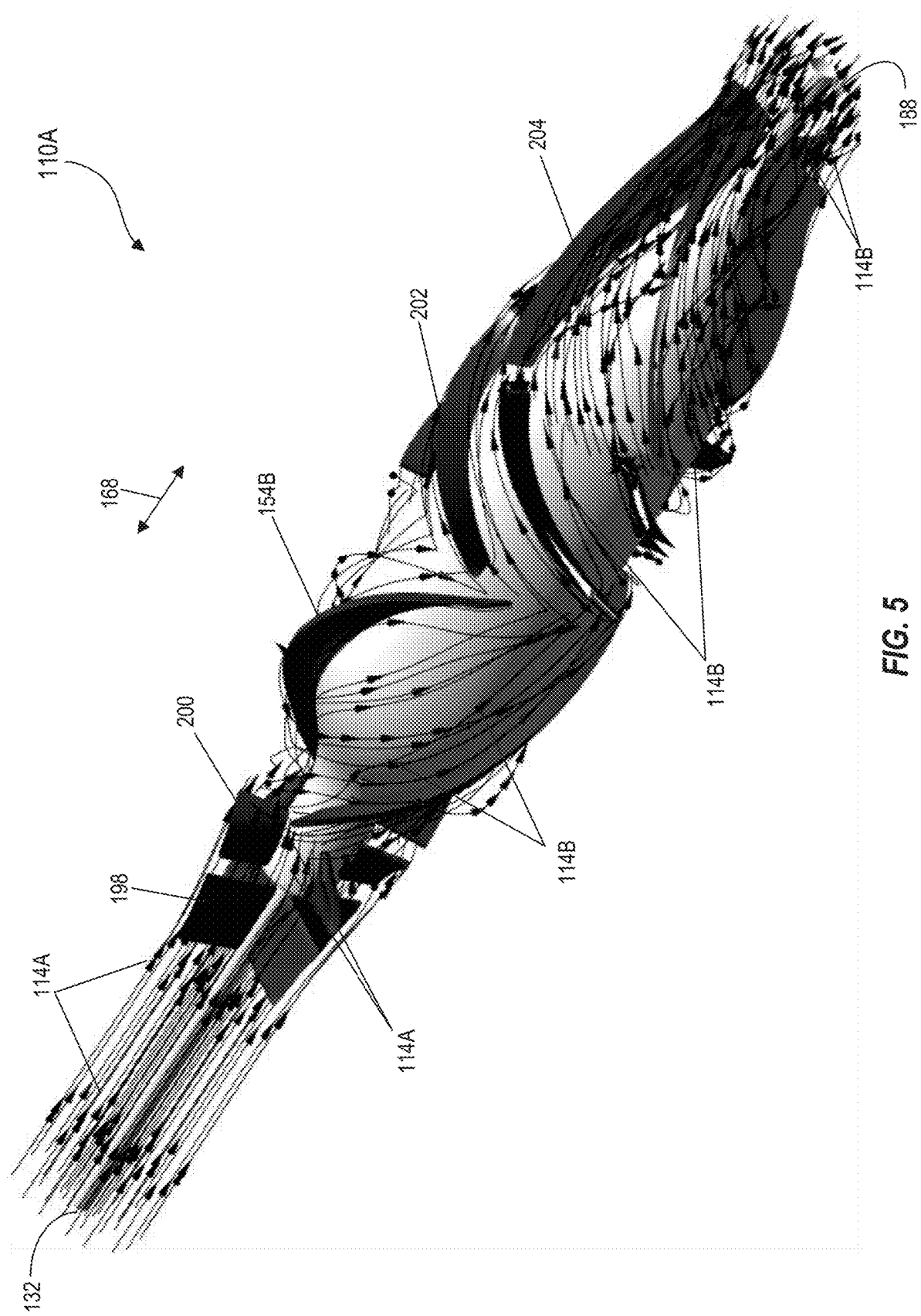
FIG. 5 illustrates a perspective view of a pump assembly in operation according to an example implementation of the present disclosure.
Figure 6:
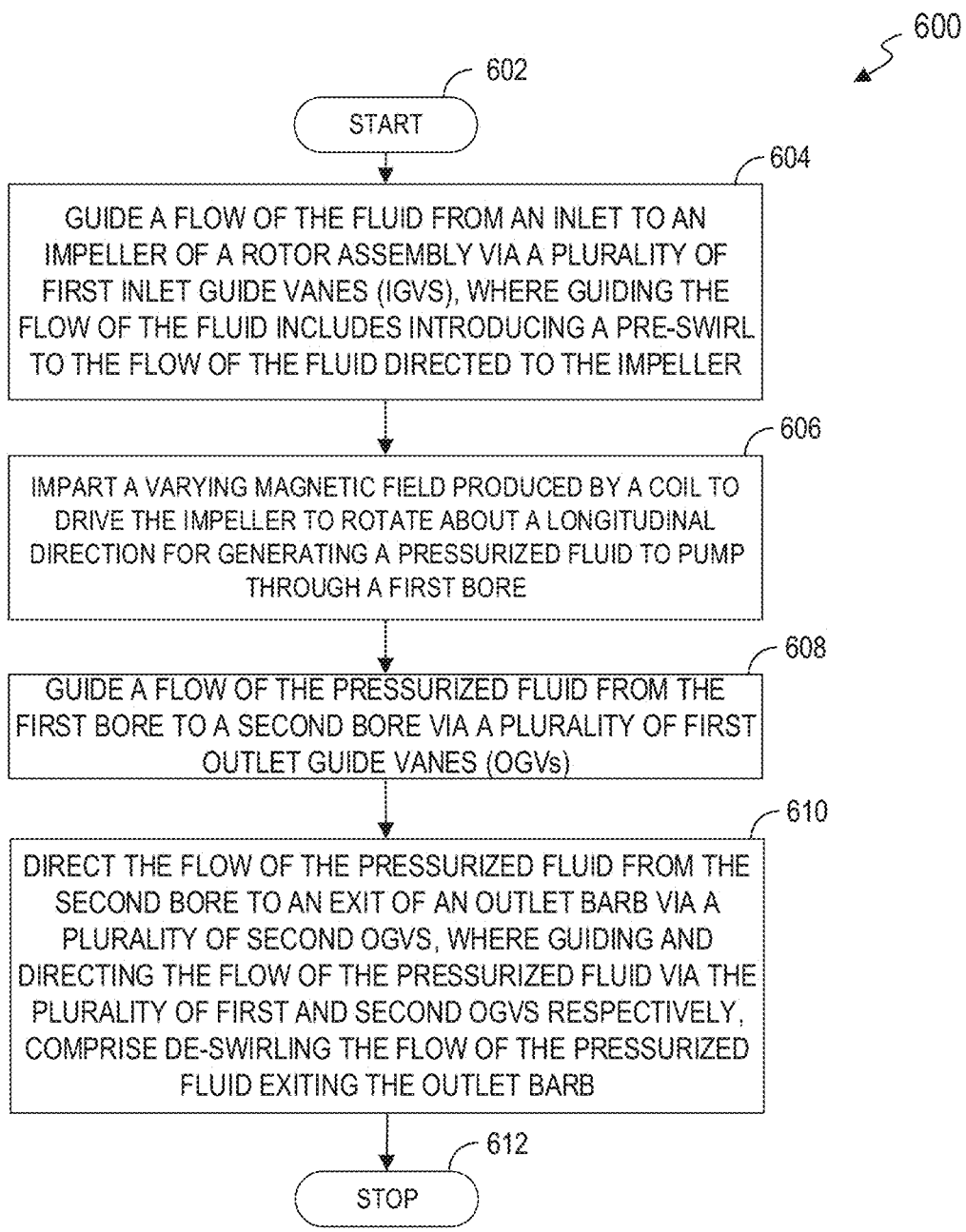
FIG. 6 is a flowchart depicting a method of pumping a fluid with pump assembly according to an example implementation of the present disclosure.

For purposes of explanation, certain examples are described with reference to the components illustrated in FIGS. 1-6. The functionality of the illustrated components may overlap, however, and may be present in a fewer or greater number of elements and components. Further, all or part of the functionality of illustrated elements may co-exist or be distributed among several geographically dispersed locations. Moreover, the disclosed examples may be implemented in various environments and are not limited to the illustrated examples. Further, the sequence of operations described in connection with FIGS. 5-6 is an example and is not intended to be limiting. Additional or fewer operations or combinations of operations may be used or may vary without departing from the scope of the disclosed examples. Thus, the present disclosure merely sets forth possible examples of implementations, and many variations and modifications may be made to the described examples. Such modifications and variations are intended to be included within the scope of this disclosure and protected by the following claims.

Pump assemblies are used to pump a cooling fluid received from a coolant distribution unit, and cooling loops connected to hose connection ports of the pump assemblies are used to circulate the cooling fluid to a waste-heat producing system of an apparatus, to absorb a waste heat produced by the waste-heat producing system, and thereby cool the waste-heat producing system. In some examples, the apparatus is a rack of servers or a server mounted in the rack, and the waste-heat producing system is a processor-based system. In such examples, the cooling fluid may absorb the waste heat produced by a circuit board and/or high-powered electronic devices, such as central processors, graphics processors, network modules, power transistors, and the like, disposed on the circuit board of the processor-based system. Typically, the pump assemblies, such as a centrifugal pump assembly or an axial pump assembly may be used to pump the cooling fluid into the rack of servers. However, the conventional pump assembly has a relatively low pumping efficiency due to, for example, the swirling or turbulent nature of the coolant fluid at an inlet and/or at an outlet of the pump assembly. In general, the turbulent nature of the coolant fluid at the inlet and/or at the outlet may be reduced by having an elongated guide vanes. However, the elongated guide vanes may occupy substantially large space in the pump assembly. Thus, a key challenge/problem is to maximize the pump efficiency or performance in a smallest package possible. Accordingly, it is desirable for the pump assembly to increase the flow of the cooling fluid at a substantially high pressure, yet have a small footprint and overall volume to minimize space occupied by the pump assembly in crowded servers or within the processor-based system itself, and other apparatus, such as a hybrid electric vehicle, for example, where the space is at a premium.

A technical solution to the aforementioned problems may include providing a pump assembly having a plurality of guide vanes (GVs) disposed within a hose connection port of the axial flow pump assembly. The plurality of GVs may streamline a flow of a cooling fluid, thereby improving pumping efficiency of the pump assembly and simultaneously occupying substantially less space of a waste-heat producing system, as the plurality of GVs is disposed within the hose connection port.

In some examples, the hose connection port may include an inlet hose barb and an outlet barb. It may be noted herein that the terms "fluid" and "cooling fluid" may be used interchangeably. In one or more examples, the outlet hose connection port includes a plurality of outlet guide vanes (OGVs), which may de-swirl the flow of an outlet cooling fluid discharged from an impeller of the pump assembly, thereby reducing fluid vortices, which may otherwise occur due to swirling or a turbulent nature of the outlet fluid discharged from the impeller. In other words, the plurality of OGVs may streamline the flow of the outlet cooling fluid discharged from the impeller, thereby increase the flow of the outlet cooling fluid at high pressure. In one or more examples, the inlet connection port may include a plurality of inlet guide vanes (IGVs), which may straighten the flow of an inlet fluid, induce pre-swirl to the inlet fluid, and direct the pre-swirling inlet fluid to the impeller, thereby reducing pressure drop, which may otherwise occur due to the turbulent nature of the flow of the inlet cooling fluid entering the impeller. In other words, the plurality of IGVs may streamline the flow of the inlet cooling fluid, thereby increasing the flow of the inlet cooling fluid entering the impeller. Since the plurality of IGVs and OGVs are disposed within a hollow space of the inlet connection port and the outlet connection port, respectively, the pump assembly may occupy less space within the waste-heat producing system, and thus have a small footprint on the assembly, while simultaneously improving the performance or pumping efficiency of the pump assembly.

Accordingly, in some examples of the present disclosure the pump assembly includes a first housing, a rotor assembly, a stator assembly, a second housing, an outlet connection port, and guide vane inserts (inlet and outlet). In one or more examples, the first housing has a first bore and a plurality of first inlet guide vanes (IGVs) coupled to an inlet of the first bore, to pre-swirl a flow of a fluid. The rotor assembly is disposed in the first bore and includes an impeller to rotate to pump the fluid through the first bore. The stator assembly is mounted around a portion of the first housing and includes a coil adapted to impart a varying magnetic field through the first housing to drive the impeller to rotate about a longitudinal direction. The second housing has a second bore fluidically coupled to the first bore, and a plurality of first outlet guide vanes (OGVs) coupled at an entrance of the second bore. The outlet connection port is coupled to the second housing. The guide vane insert includes a plurality of second OGVs, disposed within the outlet connection port and fluidically coupled to an outlet of the second bore, where the plurality of first and second OGVs de-swirl the flow of the fluid exiting the outlet connection port.

FIG. 1 depicts a block diagram of an apparatus 100 having a plurality of waste-heat producing systems 102 and at least one pump assembly 110. In the example implementation of FIG. 1, the apparatus 100 is a rack of servers 101 of a data center, the plurality of waste-heat producing systems 102 is a plurality of processor-based systems 103, and the pump assembly 110 is an axial flow pump assembly 110A. In some other example implementation, the apparatus 100 may be a hybrid electric vehicle, and the waste-heat producing system 102 may be a battery pack. Even though the apparatus 100 is shown as the rack of servers 101 in the example of FIG. 1, in some other examples, the apparatus 100 is a server mounted in the rack. Such variations in the apparatus 100 may be envisioned, without deviating from the scope of the present disclosure. In some other examples, the apparatus 100 may include the pump assembly 110, such as a centrifugal pump assembly instead of the axial flow pump assembly 110A, without deviating from the scope of the present disclosure. It may be noted herein that the example implementations discussed herein should not be construed to be restrictive, as the implementation may be extended to certain other examples without deviating from the scope of the present disclosure.

As a more specific example, the rack of servers 101 includes the plurality of processor-based systems 103, each having a circuit board 106, for example, a mother board having one or more electronic devices 108. In the shown example, one circuit board 106A includes two electronic devices 108A, 108B, and another circuit board 106B may also include one or more electronic devices (not shown in FIG. 1). The rack of servers 101 further includes the pump assembly 110 disposed in each of plurality of the processor-based systems 103, and a plurality of cooling circuits 112, each extending over the circuit board 106 and proximate to the one or more electronic devices 108. In the shown example of FIG. 1, the axial flow pump assembly 110A of the at least one pump assembly 110, is disposed in a processor-based system 103A and one cooling circuit 113 of the plurality of cooling circuits 112, extends over the circuit board 106A and proximate to the one or more electronic devices 108A, 108B. In one or more examples, another axial flow pump assembly (not shown) of the at least one pump assembly 110, may be disposed in another processor-based system 103B and another cooling circuit (not shown) of the plurality of cooling circuits 112 may extend over the circuit board 106B and proximate to one or more electronic devices (not shown). It may be noted herein, that the other axial flow pump assembly and the other cooling circuit are not shown in FIG. 1, for ease of illustration, and such an illustration should not be construed as a limitation of the present disclosure. In the example of FIG. 1, the cooling circuit 113 is an open circuit. In such examples, a row-based coolant distribution unit (not shown) may be coupled to the cooling circuit 113 for supplying a fluid, for example, a cooling fluid to the axial flow pump assembly 110A. Further, the cooling circuit 113 may circulate the cooling fluid that is pumped by the axial flow pump assembly 110A, to the processor-based system 103A for the purpose of removing a waste heat that is produced by the circuit board 106A and the one or more electronic devices 108A, 108B. In some other examples, the pump assembly 110 of the present disclosure may be used to pump fluid for a non-waste heating producing system, without deviating from the scope of the present disclosure. In some other examples, the plurality of cooling circuits 112 may be a closed circuit at each of the plurality of processor-based systems 103 level or at the rack of servers 101 level, without deviating from the scope of the present disclosure.

As discussed hereinabove, the axial flow pump assembly 110A may receive a cooled fluid 114A from the coolant distribution unit via an inlet conduit 113A of the cooling circuit 113, and an inlet connection port 116, and discharge a pressurized fluid 114B to the processor-based system 103A via an outlet connection port 118 and an outlet conduit 113B. The pressurized fluid 114B may absorb the waste heat from the circuit board 106A and the electronic devices 108A, 108B and discharge a heated fluid 114C from the processor-based system 103A via the outlet conduit 113B of the cooling circuit 113. In some examples, the heated fluid 114C may be cooled to regenerate the cooled fluid 114. In one or more examples, the electronic devices 108 may include central processing units (CPUs), switching transistors of power converters, graphics processing units (GPUs), network modules, power transistors, and so forth that are disposed on the circuit board 106. Due to the turbulent nature of the cooling fluid 114A at an inlet and the pressurized fluid 114B at the outlet, a conventional pump assembly may not be capable of pumping sufficient amount of pressurized fluid 114B at a substantially high pressure to absorb the waste heat produced by each of the plurality of processor-based systems 103. In accordance to some example implementations of the present disclosure, each of the inlet hose connection port 116 and the outlet hose connection port 118 of the axial flow pump assembly 110A may include guide vanes (GVs) to increase a flow of the pressurized fluid 114B at high pressure and simultaneously utilize a hollow space of the hose connection ports 116, 118. Thus, the GVs of the present disclosure may occupy less space within the processor-based system 103A, and have small footprint in the rack of servers 101, while simultaneously improving the fluid pumping efficiency or performance of the axial flow pump assembly 110A. It may be noted herein that the hose connection ports and the GVs are discussed in greater details below.

Figure 2A:
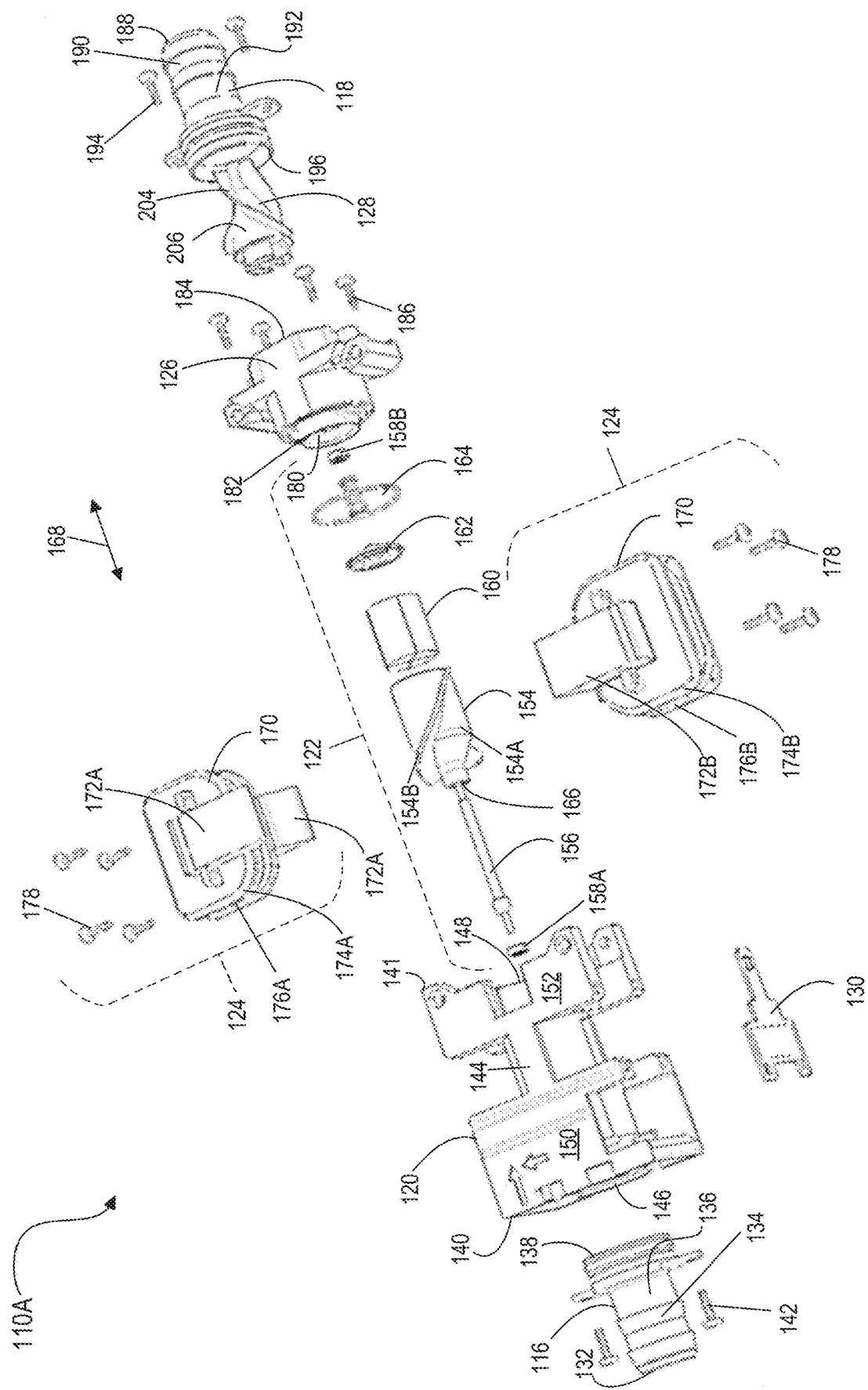
FIG. 2A illustrates an exploded perspective view of a pump assembly according to an example implementation of the present disclosure.
Figure 2B:
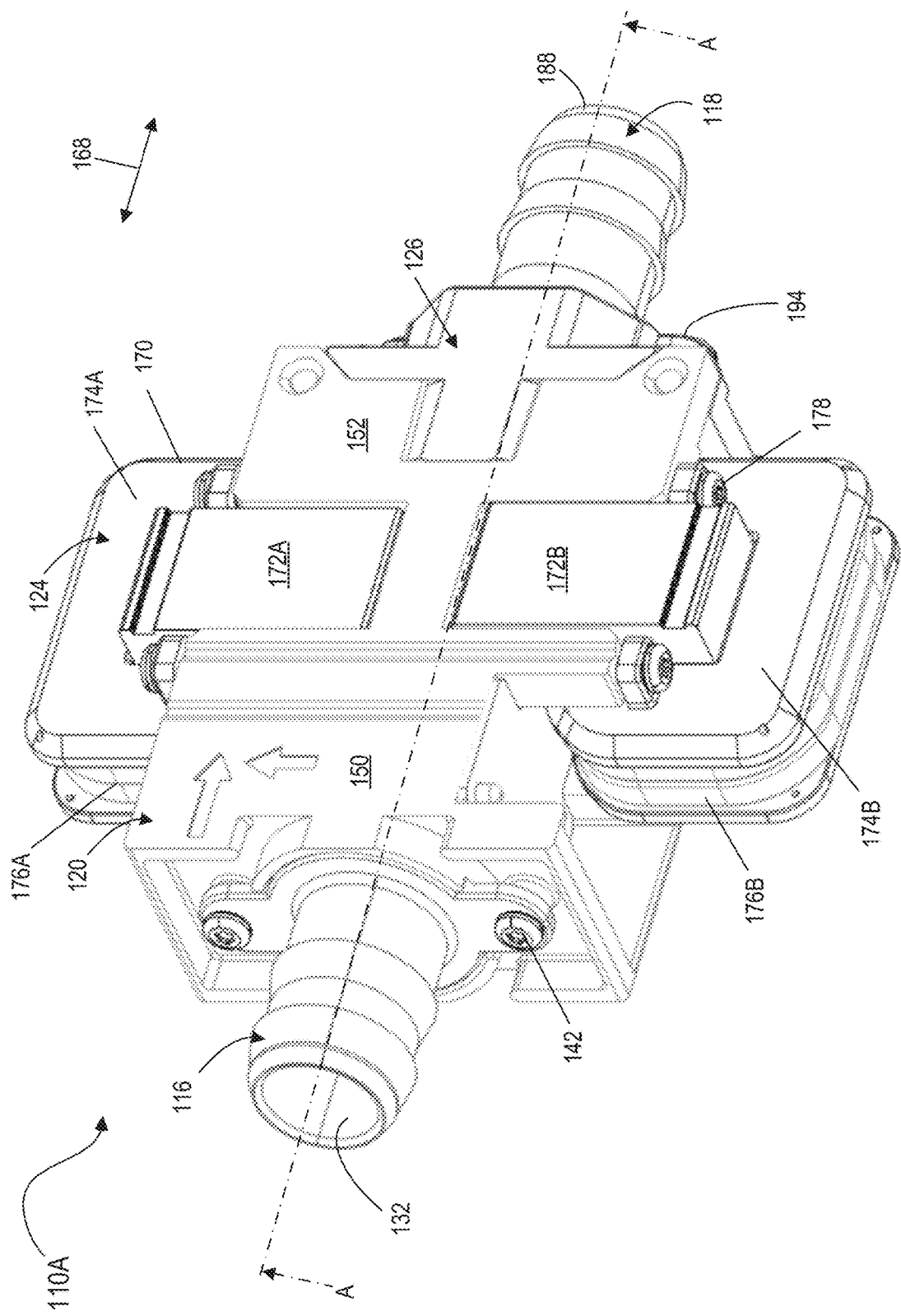
FIG. 2B illustrates an assembled perspective view of the pump assembly of FIG. 2A according to an example implementation of the present disclosure.

FIG. 2A depicts an exploded perspective view of the pump assembly, for example, the axial flow pump assembly 110A of FIG. 1, and FIG. 2B is an assembled perspective view of the pump assembly, for example, the axial flow pump assembly 110A of FIG. 2A. In one or more examples, the axial flow pump assembly 110A includes an inlet connection port 116, a first housing 120, a rotor assembly 122, a stator assembly 124, a second housing 126, an outlet connection port 118, an guide vane insert 128, and a controller circuit board 130.

The inlet connection port 116 is a hollow cylindrical component for attaching and securing of the inlet conduit 113A (as shown in FIG. 1) to an entry 132 of the inlet connection port 116. In the example of FIG. 2A, the inlet connection port 116 is an inlet hose barb. In such examples, the inlet connection port 116 includes rings 134 on an outer surface 136 to allow for an easy push-connection of the inlet conduit 113A that is not so easily disconnected from the inlet connection port 116. In some other examples, the inlet connection port 116 may be a normal inlet hose connector. In such examples, the entry 132 of the inlet connection port 116 may be coupled to the inlet conduit 113A using adhesives, clamps, O-ring seals, and the like. In some examples, the inlet connection port 116 includes a plurality of second inlet guide vanes (IGVs, not shown in FIG. 2A) coupled proximate to an exit 138 of the inlet connection port 116. Further, the inlet connection port 116 may be coupled to a first side 140 of the first housing 120 via a plurality of fasteners 142. It may be noted herein that the term "a plurality of second inlet guide vanes" has been used prior to the term "a plurality of first inlet guide vanes" to maintain consistency between the usage to terms in the specification and claims.

The first housing 120 may have a first bore 144 extending between an inlet 146 and an exit 148 of the first bore 144. Further, the first housing 120 includes a first support structure 150 and a second support structure 152 spaced apart from each other and formed over the bore 144. The first support structure 150 may house the controller circuit board 130 along one peripheral side, as shown in FIG. 2B. Further, the first housing 120 includes a plurality of first IGVs (not shown in FIG. 2A) coupled to the inlet 146 of the inlet connection port 116.

The rotor assembly 122 may include an impeller 154, a shaft 156, a first bearing 158A, a second bearing 158B, a permanent magnet 160, a protective lid 162, and a sealant 164. The impeller 154 includes a hub 154A and a plurality of blades 154B disposed over the hub 154A. Further, the impeller 154 may include a through-hole 166 to allow the shaft 156 to pass through the impeller 154. The shaft 156 may be rigidly coupled to the through-hole 166. The impeller 154 may further include a cylindrical pocket (not shown) to house the permanent magnet 160 within the cylindrical pocket. In such examples, the protective lid 162 may cover the cylindrical pocket such that the permanent magnet 160 is concealed within the impeller 154 and not exposed to a cooling fluid 114A during operation. The first and second bearings 158A, 158B respectively are disposed at two ends of the shaft 156 to allow the rotational movement of the rotor assembly 122 relative to the first housing 120 about a longitudinal direction 168. It may be noted herein that the longitudinal axis 168 extends along an axial direction of the axial flow pump assembly 110A. The rotor assembly 122 may be disposed in the first bore 144 such that the impeller 154 is disposed proximate to the plurality of second IGVS. The rotor assembly may rotate about the longitudinal axis 168 to pump the cooling fluid 114A through the first bore 144.

The stator assembly 124 may have a stator 170 and a pair of clamping members 172A, 172B coupled to the stator 170. In some examples, the stator 170 is formed by two lamination stacks 174A, 174B and two coils 176A, 176B. The lamination stacks 174A, 174B holds the respective coils 176A, 176B, and may optionally be mounted on a bobbin (not shown) and/or wrapped to retain the respective coils 176A, 176B in position. The two lamination stacks 174A, 174B may be assembled to one another, such that the stator assembly 124 is mounted around a portion of the first housing 120. For example, the stator 170 is mounted between the first and second support structures 150, 152 of the first housing 120. In other words, the stator 170 is disposed substantially over the impeller 154. Further, the lamination stacks 174A, 174B may be coupled to one another via the pair of clamping members 172A, 172B and a plurality of fasteners 178. The coils 176A, 176B may be electrically actuated via the controller circuit board 130, to produce a varying magnetic field so as to drive the impeller 154 to rotate about the longitudinal axis 168. In other words, the coils 176A, 176B may impart the varying magnetic field through the first housing 120 to drive the impeller 154 to rotate about the longitudinal direction 168. In such examples, the rotation of the impeller 154 may cause the blades 154B of the impeller 154 to pump the cooling fluid 114A to move through the first bore 144 of the first housing 120.

The second housing 126 is a cylindrical component having a second bore 180 extending between an entrance 182 and an outlet 184 of the second bore 180. It may be noted herein that the inlet 146 of the first housing 120 and the outlet 184 of the second housing 126 may be construed as the inlet and outlet of the axial flow pump assembly 110A. In some examples, the second housing 126 is coupled to a second side 141 of the first housing 120 via the plurality of fasteners 186, such that the entrance 182 of the second housing 126 faces the exit 148 of the first housing 120 and the second bore 180 is fluidically coupled to the first bore 144. The second housing 126 includes a plurality of first outlet guide vanes (OGVs, not shown in FIGS. 2A, 2B) coupled at the entrance 182 of the second bore 180.

The outlet connection port 118 is a hollow cylindrical component for attaching and securing of an outlet conduit 113B (as shown in FIG. 1) to an exit 188 of the outlet connection port 118. In the example of FIG. 2A, the outlet connection port 118 is an outlet hose barb. In such examples, the outlet connection port 118 includes rings 190 on an outer surface 192 to allow for an easy push-connection of outlet conduit 113B that is not so easily disconnected from the outlet connection port 118. In some other examples, the outlet connection port 118 may be an outlet hose connector. In such examples, the exit 188 of the outlet connection port 118 may be coupled to the outlet conduit 113B using adhesives, clamps, O-ring seals, and the like. The outlet connection port 118 is coupled to the second housing 126 via a plurality of fasteners 194, such that an entry 196 of the outlet connection port 118 is fluidically coupled to the outlet 184 of the second housing 126.

The guide vane insert 128 includes a plurality of second OGVs 204 disposed over an outer surface 206 of the guide vane insert 128. In one or more examples, the guide vane insert 128 is disposed within a hollow space of the outlet connection port 118 and fluidically coupled to the outlet 184 of the second bore 180. Since the plurality of second IGVs are disposed within the hollow space of the inlet connection port 116 and the plurality of second OGVs 204 are disposed within the hollow space of the outlet connection port 118, the axial flow pump assembly 110A may not take up excessive space of the processor-based system 103A, thus having a small footprint on the rack of the servers 101.

During operation, the axial flow pump assembly 110A may receive a cooling fluid 114A from coolant distribution unit (not shown) via an inlet conduit 113A (as shown in FIG. 1). For example, the cooling fluid 114A may first enter the inlet connection port 116 from the inlet conduit 113A. In such examples, the plurality of second IGVs (not shown in FIGS. 2A and 2B) may straighten a flow of the cooling fluid 114A and direct the flow of the cooling fluid 114A from the inlet connection port 116 to the inlet 146 of the first bore 144. Further, the plurality of first IGVs (not shown in FIGS. 2A and 2B) of the first housing 120 may pre-swirl the cooling fluid 114A and direct the flow of the cooling fluid 114A from the inlet 146 to the impeller 154 of the rotor assembly 122. The stator assembly 124 is electrically actuated by the controller circuit board 130, to produce a varying magnetic field that causes the rotor assembly 122 to rotate about the longitudinal direction 168. For example, the coils 176A, 176B of the stator 170 may impart the varying magnetic field on the impeller 154 so as to drive the impeller 154 to rotate, thereby causing the blades 154B to displace the cooling fluid 114A, generate a pressurized cooling fluid 114B, and pump the pressurized cooling fluid 114B through the first bore 144. Later, the plurality of first OGVs (not shown in FIGS. 2A and 2B) of the second housing 126 guides a flow of the pressurized cooling fluid 114B from the first bore 144 to the second bore 180. The plurality of second OGVs 204 of the guide vane insert 128, which is disposed within the outlet connection port 118, further directs the flow of the pressurized cooling fluid 114B from the second bore to the exit 188 of the outlet connection port 118 via the outlet 184 of the second housing 126. In such examples, the plurality of first OGVs and the plurality of second OGVs 204 de-swirls the flow of the pressurized cooling fluid 114B before discharging the pressurized cooling fluid 114B from the exit 188 of the outlet connection port 118. Thus, the plurality of second IGVs and the plurality of second OGVs 204 may streamline the flow of the cooling fluid and the pressurized cooling fluid 114A, 114B respectively, so as to improve the fluid pumping efficiency or performance of the axial flow pump assembly 110A. In some examples, the axial flow pump assembly 110A discharges the pressurized cooling fluid 114B to an outlet conduit 113b (as shown in FIG. 1), where the pressurized fluid 114B flows in thermal contact with the circuit boards 106A, 106B and the one or more electronic devices 108A, 108b to absorb the heat from those components, and thereby produce a heated fluid 114C. In some examples, the heated fluid 114C may be discharged from the processor-based system 103A via the outlet conduit 113B. The heated fluid 114C may be subsequently cooled via a plurality of heat exchangers to produce the cooled fluid 114A. The process of pumping and circulating the cooled fluid 114A, as described herein, may be performed continually. In some examples, the cooling fluid 114 is a liquid and the axial flow pump assembly 110A is a liquid pump.

Figure 3A:
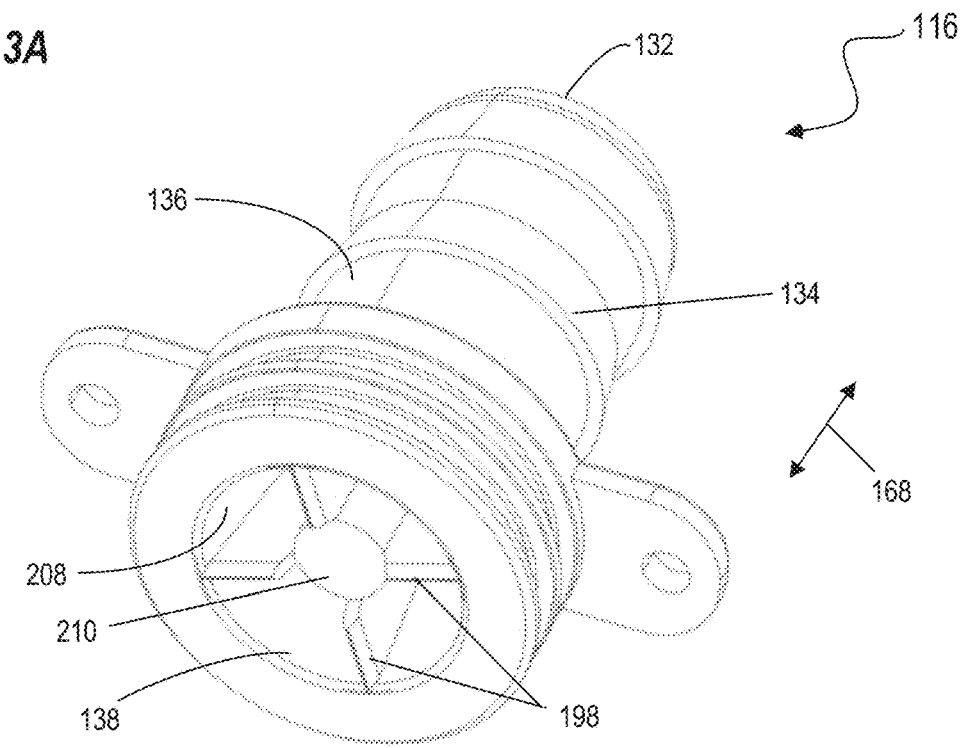
FIG. 3A illustrates a perspective view of an inlet connection port of the pump assembly of FIG. 2A according to an example implementation of the present disclosure.

FIG. 3A depicts a perspective view of the inlet connection port 116 of the pump assembly, for example, the axial flow pump assembly 110A of FIG. 2A. As discussed in the example of FIG. 2A, the inlet connection port 116 is a hollow cylindrical component having an inner surface 208 and an outer surface 136. Further, the inlet connection port 116 has an entry 132 to allow the inlet conduit 113A (as shown in FIG. 1) to be coupled to the axial flow pump assembly 110A. The inlet connection port 116 further includes rings 134 on the outer surface 136 to allow for an easy push-connection of the inlet conduit 113A that is not so easily disconnected from the inlet connection port 116. In one or more examples, the inlet connection port 116 includes a plurality of second inlet guide vanes (IGVs) 198 coupled proximate to an exit 138 of the inlet connection port 116. For example, the plurality of second IGVs 198 is coupled to the inner surface 208 and to a center support structure 210. In one or more examples, each of the plurality of second IGVs 198 is oriented substantially parallel to the longitudinal direction 168. In such examples, each of the plurality of second IGVs 198 may straighten the flow of the cooling fluid 114A along the longitudinal direction 168. In one or more examples, the inlet connection port 116 may be manufactured using one or more of a machining technique, an injection molding technique, a 3D printing technique, or other applicable manufacturing technique. Since, the inlet connection port 116 having the plurality of second IGVs 198 may be manufactured in any of the aforementioned techniques, it may provide value, low cost manufacturing capabilities, and competiveness that is demanded by various industries to provide a coolant system.

Figure 3B:
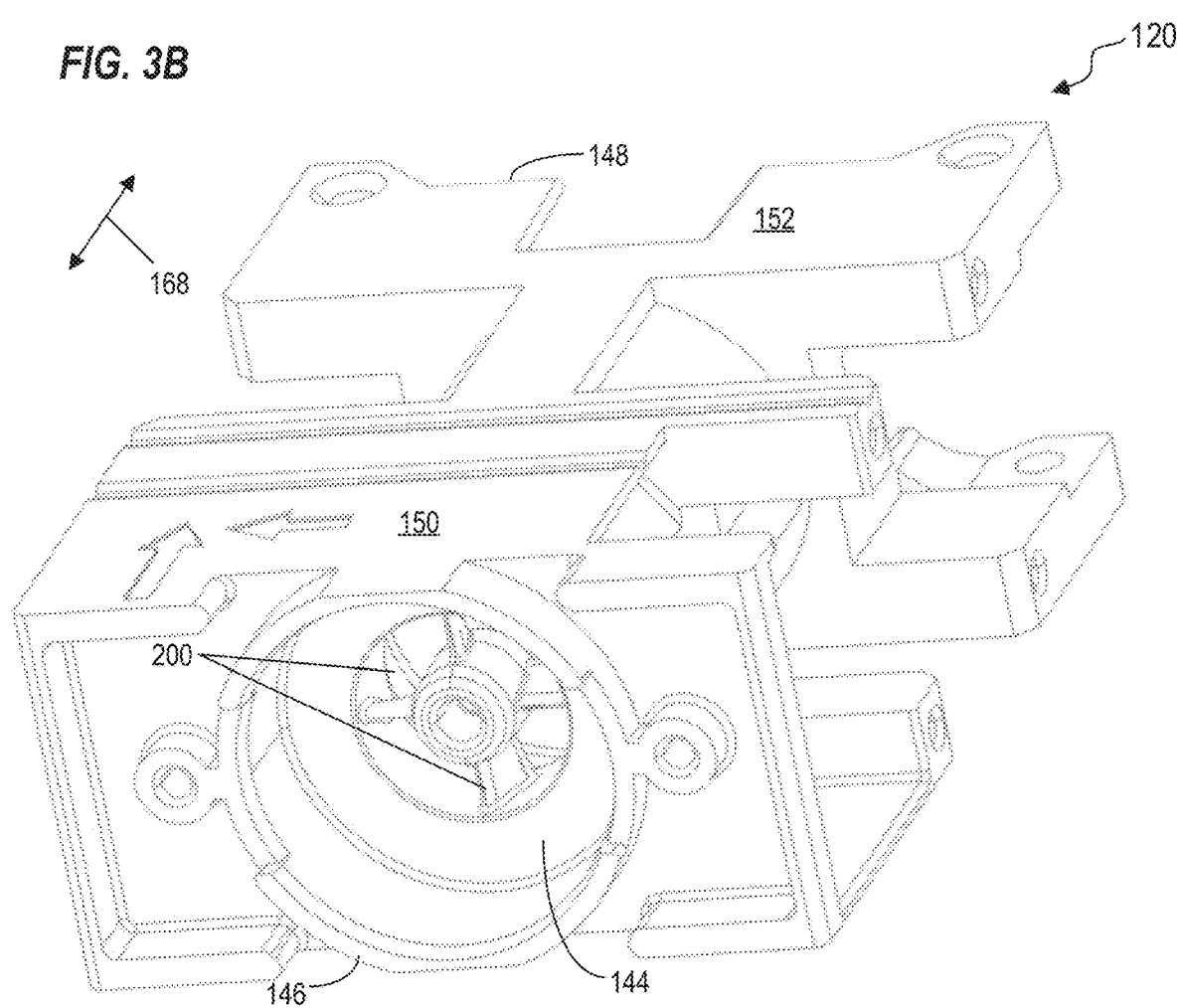
FIG. 3B illustrates a perspective view of a first housing of the pump assembly of FIG. 2A according to an example implementation of the present disclosure.

FIG. 3B depicts a perspective view of a first housing 120 of the pump assembly, for example, the axial flow pump assembly 110A of FIG. 2A. As discussed in the example of FIG. 2A, the first housing 120 includes a first bore 144 extending between an inlet 146 and an exit 148 of the first bore 144. Further, the first housing 120 includes a first support structure 150 and a second support structure 152 spaced apart from each other and formed over the bore 144. The first housing 120 further includes a plurality of first IGVs 200 coupled proximate to the inlet 146. In one or more examples, each of the plurality of first IGVs 200 is a curved blade. In such examples, each of the plurality of first IGVs 200 may pre-swirl the flow of the cooling fluid 114A.

Figure 3C:
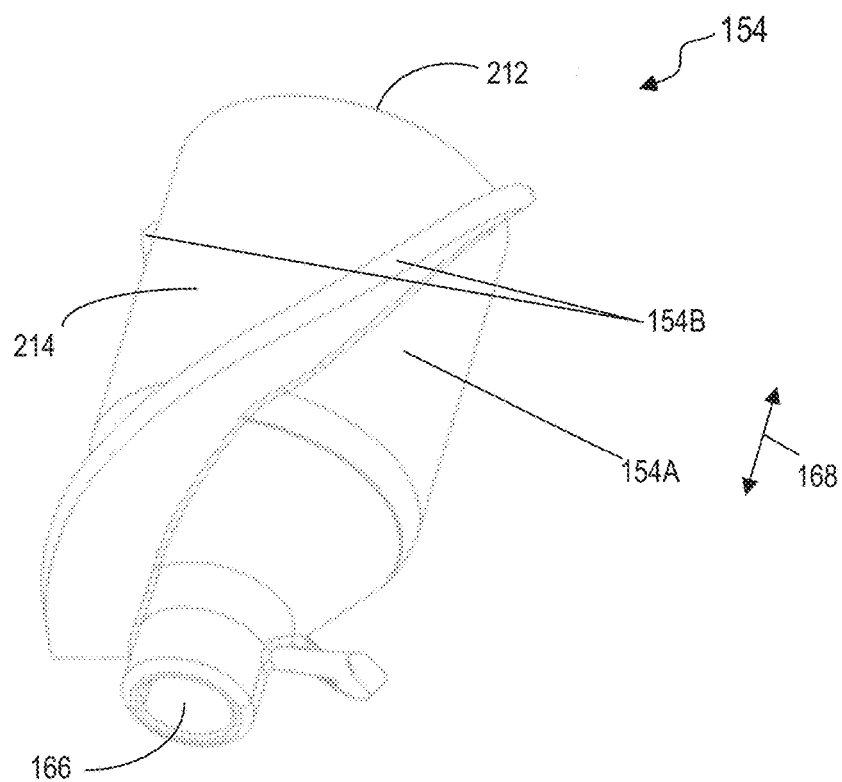
FIG. 3C illustrates a perspective view of an impeller of the pump assembly of FIG. 2A according to an example implementation of the present disclosure.

FIG. 3C depicts a perspective view of an impeller 154 of the pump assembly, for example, the axial flow pump assembly 110A of FIG. 2A. As discussed in the example of FIG. 2A, the impeller 154 includes a through-hole 166 to allow a shaft 156 (as shown in FIG. 2A) to pass through the impeller 154. In some examples, the shaft 156 may be rigidly coupled to the through-hole 166. The impeller 154 may further include a permanent magnet 160 (as shown in FIG. 2A) disposed within a cylindrical pocket (not shown) formed at rear side 212 of the impeller 154. Further, the impeller 154 includes a hub 154A and a plurality of blades 154B disposed over an outer surface 214 of the hub 154A. In one or more examples, the impeller 154 may rotate about the longitudinal direction 168, thereby causing the blades 154B to displace the cooling fluid 114A, generate a pressurized cooling fluid 114B, and move (pump) the pressurized cooling fluid 114B through the first bore 144 (as shown in FIGS. 2A and 3B).

Figure 3D:
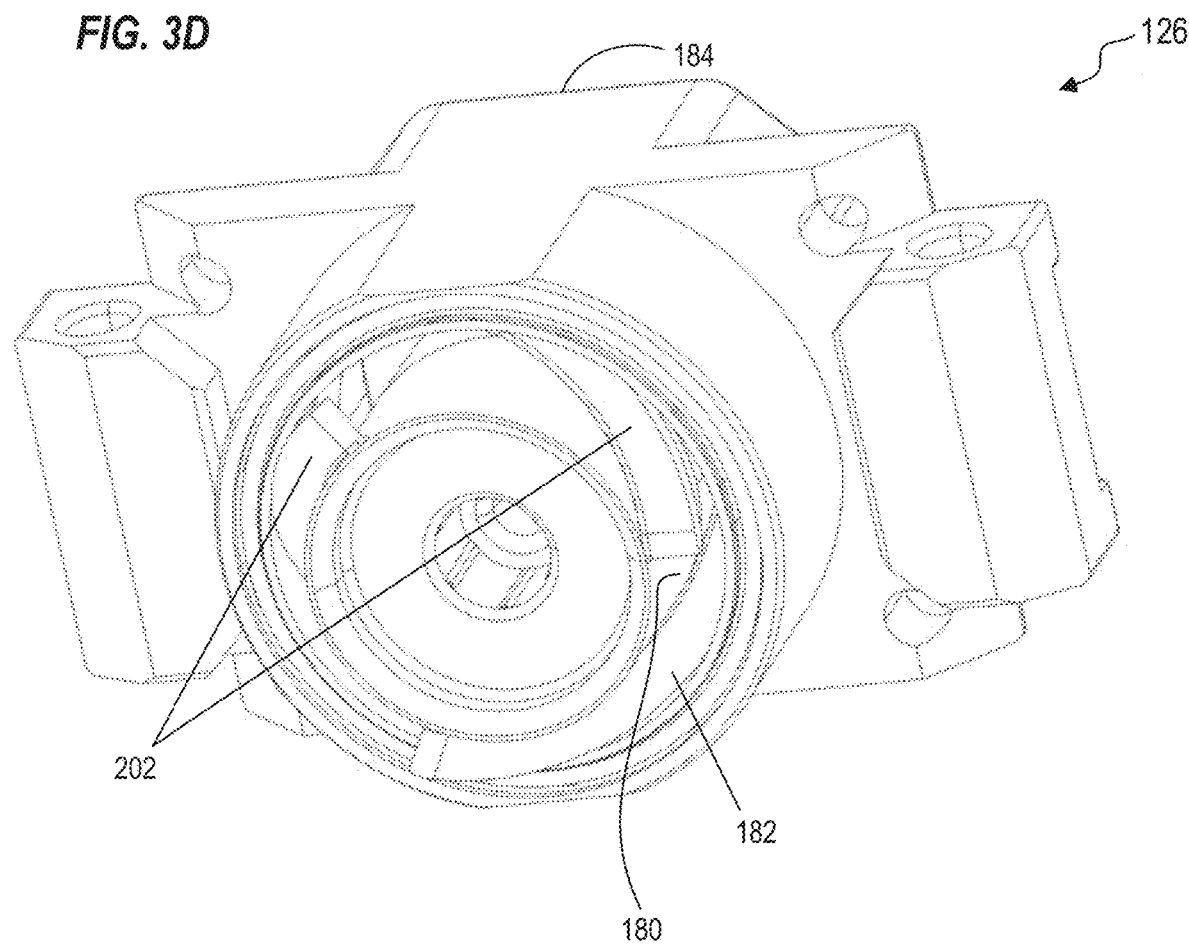
FIG. 3D illustrates a perspective view of a second housing of the pump assembly of FIG. 2A according to an example implementation of the present disclosure.

FIG. 3D depicts a perspective view of a second housing 126 of the pump assembly, for example, the axial flow pump assembly 110A of FIG. 2A. As discussed in the example of FIG. 2A, the second housing 126 has a second bore 180 extending between an entrance 182 and an outlet 184 of the second bore 180. The second housing 126 further includes a plurality of first OGVs 202 coupled proximate to the entrance 182. In one or more examples, each of the plurality of first OGVs 202 is a curved blade. In such examples, each of the plurality of first OGVs 202 may de-swirl the flow of the pressurized cooling fluid 114B.

Figure 3E:
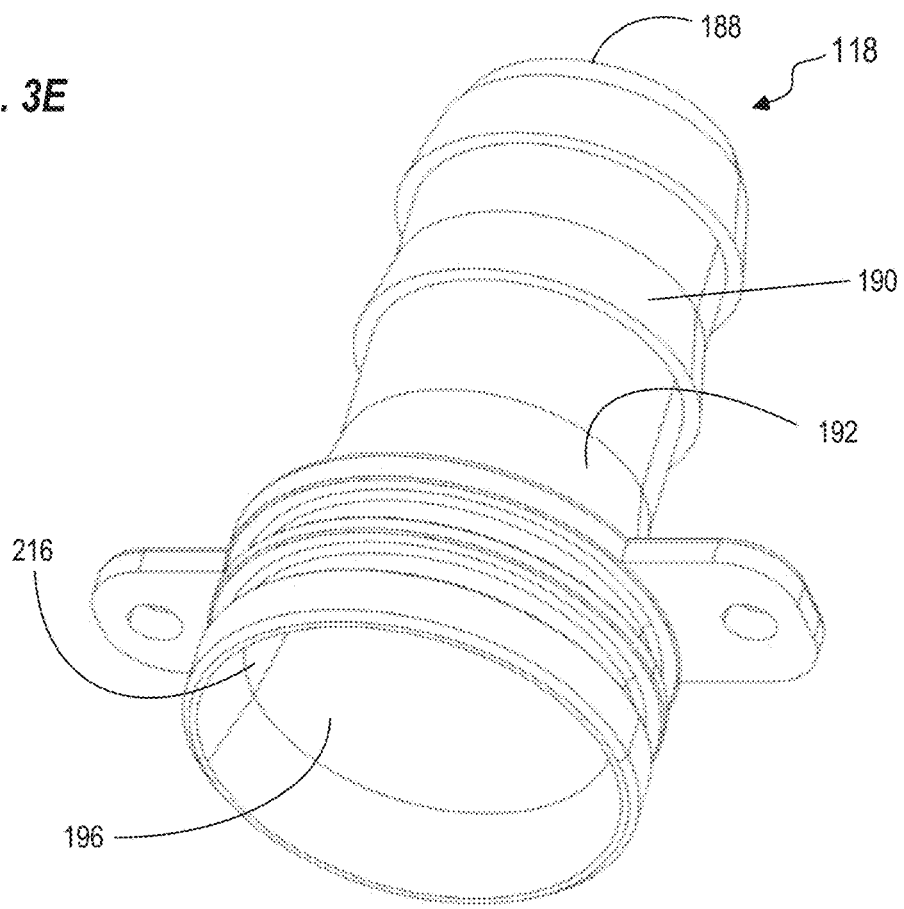
FIG. 3E illustrates a perspective view of an outlet connection port of the pump assembly of FIG. 2A according to an example implementation of the present disclosure.

FIG. 3E depicts a perspective view of an outlet connection port 118 of the pump assembly, for example, the axial flow pump assembly 110A of FIG. 2A. As discussed in the example of FIG. 2A, the outlet connection port 118 is a hollow cylindrical component having an inner surface 216 and an outer surface 192. Further, the outlet connection port 118 has an exit 188 to allow the outlet conduit 113B (as shown in FIG. 1) to be coupled to the axial flow pump assembly 110A. Similarly, the outlet connection port 118 has an entry 196, which may be coupled to an outlet 184 of a second housing 126 (as shown in FIG. 3D). The outlet connection port 118 further includes rings 190 on the outer surface 192 to allow for an easy push-connection of the outlet conduit 113B that is not so easily disconnected from the outlet connection port 118.

Figure 3F:
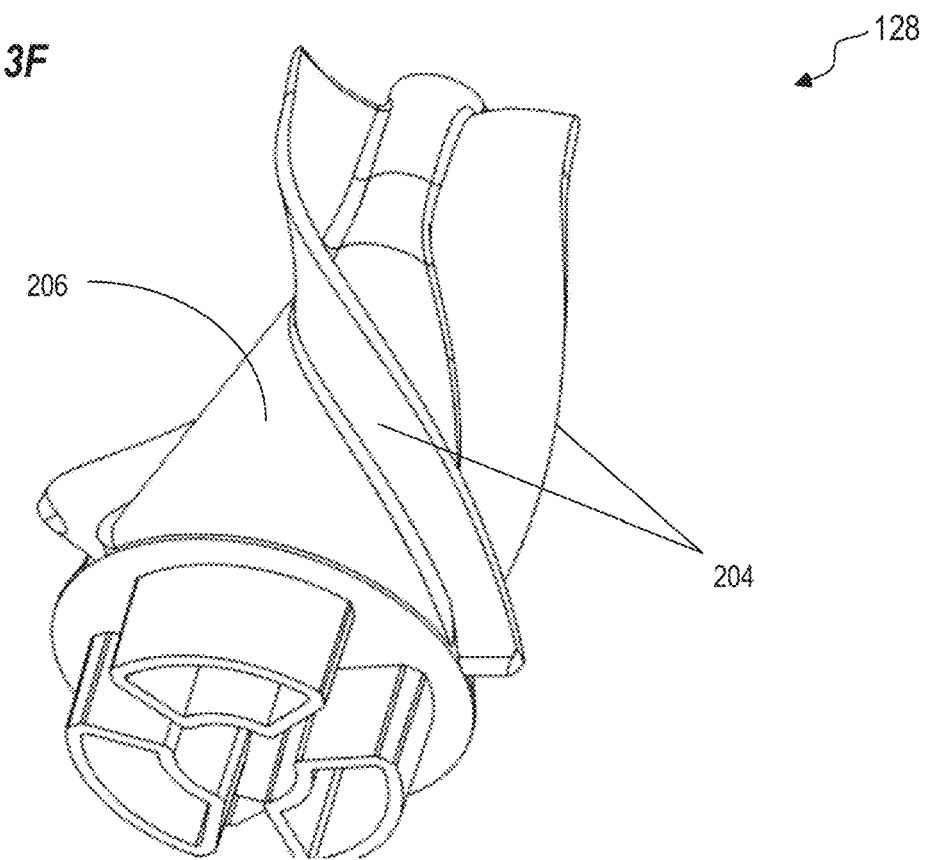
FIG. 3F illustrates a perspective view of a guide vane insert of the pump assembly of FIG. 2A according to an example implementation of the present disclosure.

FIG. 3F depicts a perspective view of a guide vane insert 128 of the pump assembly, for example, the axial flow pump assembly 110A of FIG. 2A. In one or more examples, the guide vane insert 128 includes a plurality of second OGVs 204. For example, the plurality of second OGVs 204 is coupled to an outer surface 206 of the guide vane insert 128. In one or more examples, each of the plurality of second OGVs 204 is a curved blade. In such examples, the plurality of second OGVs 204 may de-swirl the flow of the pressurized cooling fluid 114B. In one or more examples, the outlet connection port 118 may be manufactured using one or more of a machining technique, an injection molding technique, a 3D printing technique, or any other appropriate manufacturing technique. In some examples, the guide vane insert 128 and the outlet connection port 118 may be manufactured separately using one or more of a machining technique, an injection molding technique, a 3D printing technique, or any other appropriate manufacturing technique. Since the outlet connection port 118 and the guide vane insert 128 may be manufactured in any of the aforementioned techniques, it may provide value, low cost manufacturing capabilities, and competiveness that is demanded by various industries to provide a coolant system.

Figure 3G:
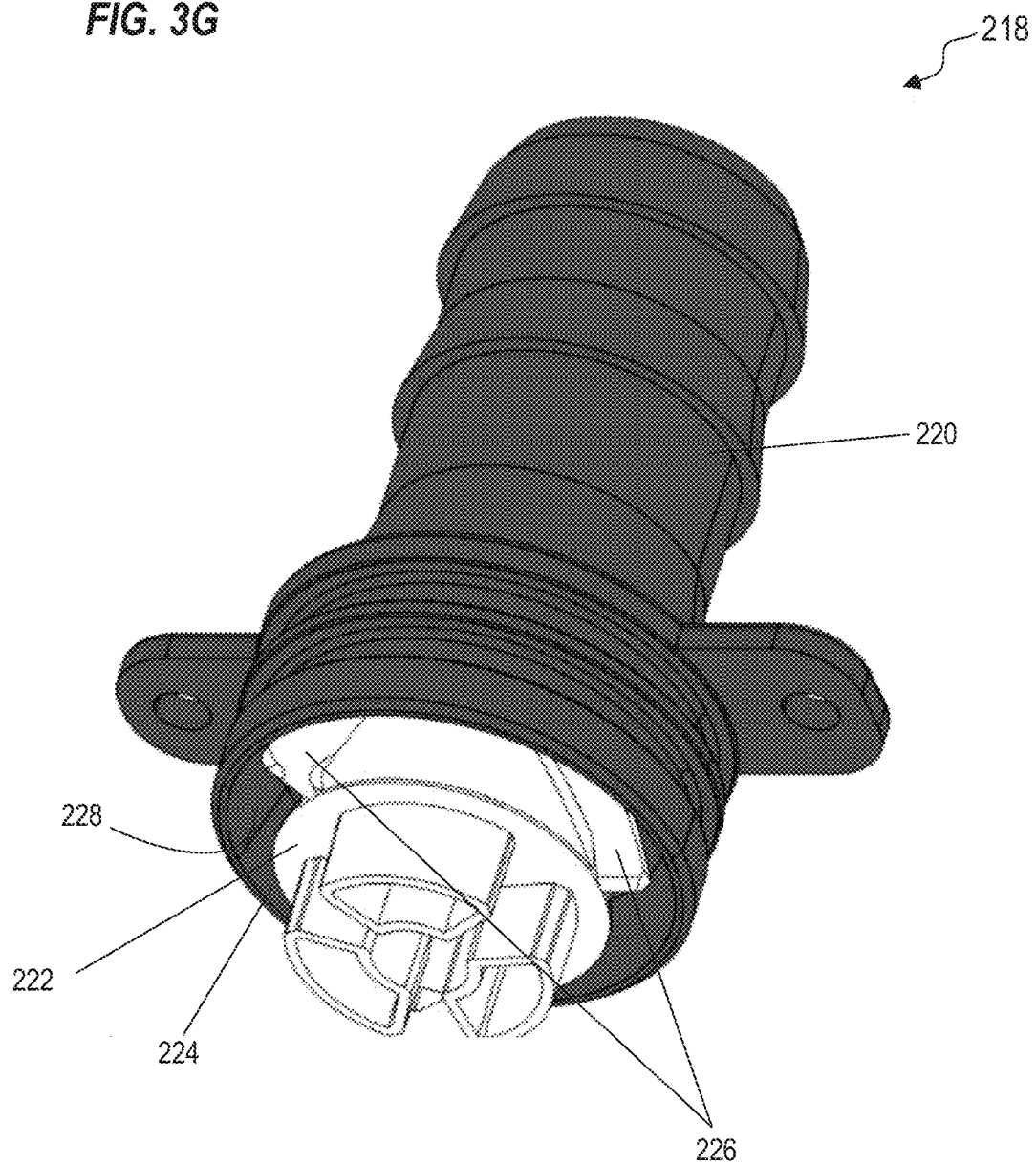
FIG. 3G illustrates a perspective view of a unitary component, for example, a unitary guide vane hose connection port of a pump assembly according to an example implementation of the present disclosure.

FIG. 3G depicts a perspective view of a unitary component, for example, a unitary guide vane hose connection port 218 of a pump assembly. The unitary guide vane hose connection port 218 includes an outlet connection port 220 and a guide vane insert 222. It may be noted herein that the outlet connection port 220 is substantially similar to the outlet connection port 118 of FIG. 2A and the guide vane insert 222 is substantially similar to the guide vane insert 128 of FIG. 2A. In some examples, a major portion of the guide vane insert 222 is disposed within a cavity 224 of the outlet connection port 220 and coupled to an inner surface 228 of the outlet connection port 220. In one or more examples, the outlet connection port 220 and the guide vane insert 222 are coupled to one another to form the unitary guide vane hose connection port 218 having the plurality of second OGVs 226. In such examples, the unitary guide vane hose connection port 218 is manufactured using one or more of a machining technique, an injection molding technique, a 3D printing technique, or any other appropriate manufacturing technique. Since, the unitary guide vane hose connection port 218 may be manufactured in any of the aforementioned techniques, it may provide value, low cost manufacturing capabilities, and competiveness that is demanded by various industries to provide a coolant system.

Figure 4A:
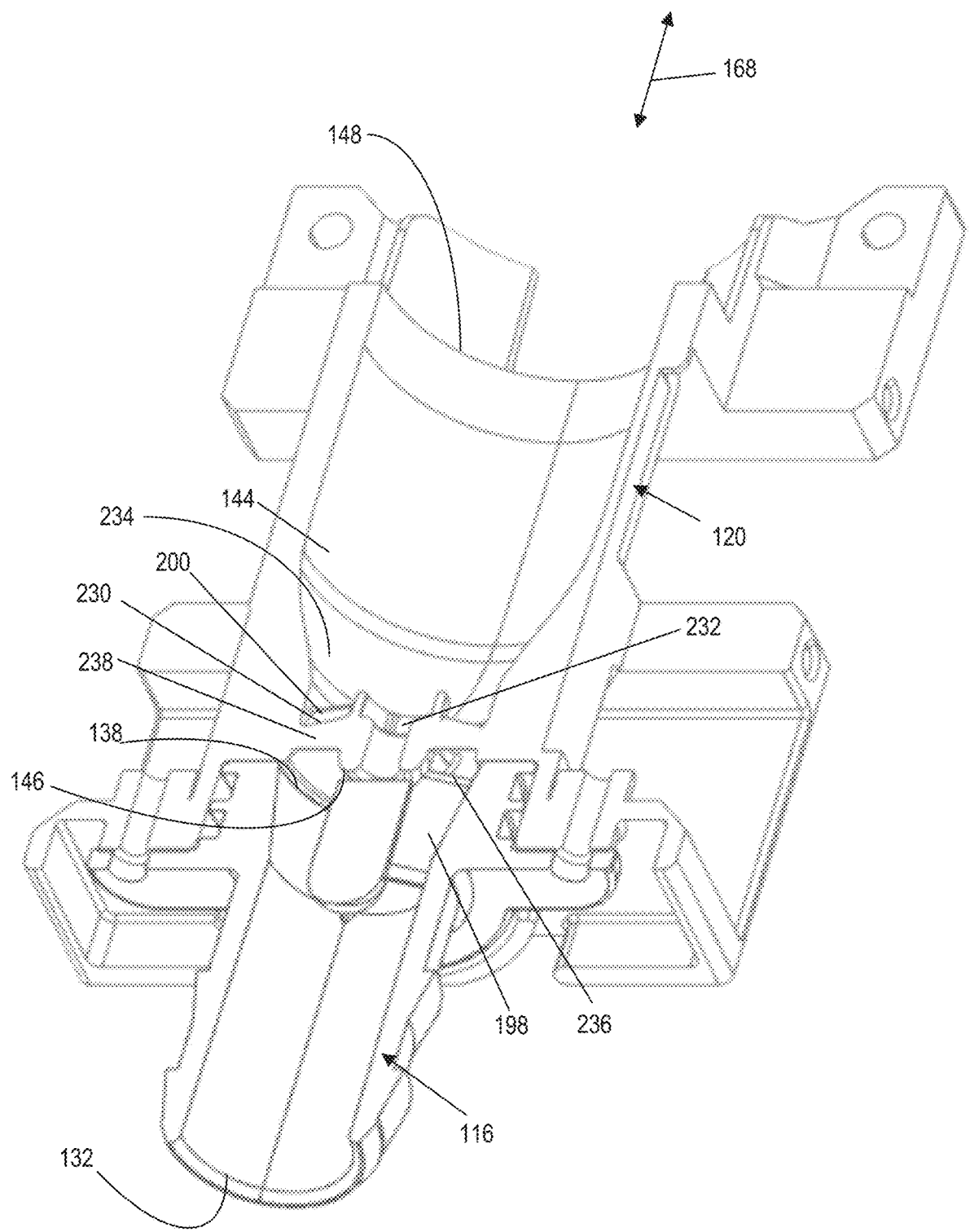
FIG. 4A illustrates a perspective sectional view of an inlet connection port and a first housing of the pump assembly taken along a line A-A of FIG. 2B according to an example implementation of the present disclosure.

FIG. 4A depicts a perspective sectional view of an inlet connection port 116 and a first housing 120 of the pump assembly, for example, the axial flow pump assembly 110A taken along a line A-A of FIG. 2B. As discussed in the example of FIGS. 2A, 2B, 3A, 3B, the inlet connection port 116 is a hollow cylindrical component having an entry 132 and an exit 138. The inlet connection port 116 further includes a plurality of second IGVs 198 disposed within the hollow cylindrical component and coupled proximate to the exit 138. The first housing 120 includes a first bore 144 extending between an inlet 146 and an exit 148 of the first bore 144. The first housing 120 further includes a plurality of first IGVs 200 coupled to the inlet 146. For example, the first housing 120 includes a first coupler 230 having a first receptor 232 disposed proximate to the inlet 146. The plurality of first IGVs 200 is coupled to the first coupler 230 and an inner surface 234 of the first housing 120. Further, each of the plurality of second IGVs 198 is oriented substantially parallel to the longitudinal direction 168 and a trailing edge 236 of each second IGV 198 is aligned to a leading edge 238 of a corresponding first IGV 200 to streamline the flow of the cooling fluid 114A (as shown in FIG. 1) there between. In some examples, each second IGV 198 straightens the flow of cooling fluid 114A along the longitudinal direction 168 and directs the flow of the cooling fluid 114A towards the corresponding first IGV 200. In such examples, each first IGV 200 may pre-swirl the cooling fluid 114A before directing the cooling fluid 114A to an impeller 154 (as shown in 4B).

Figure 4B:
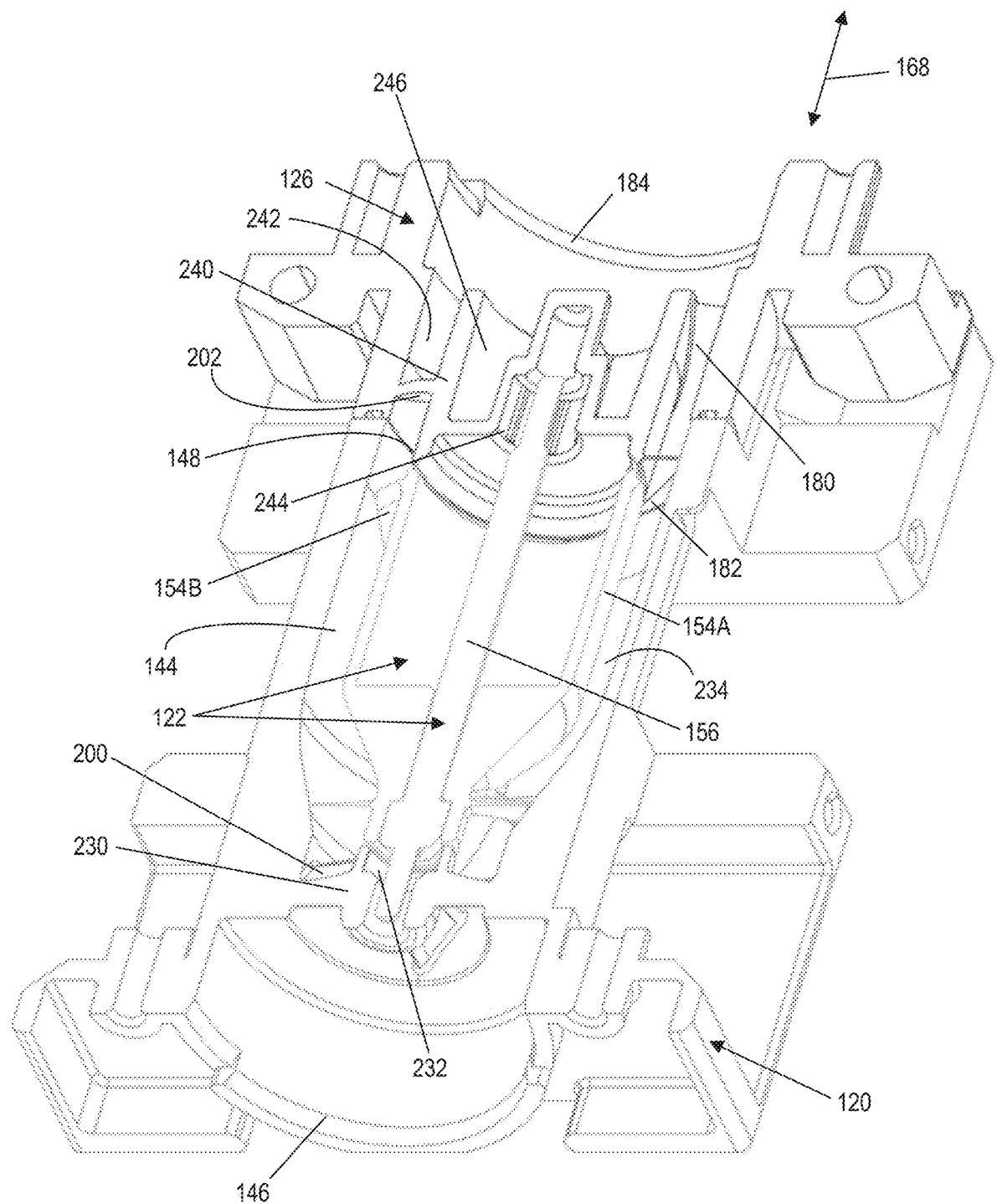
FIG. 4B illustrates a perspective sectional view of a first housing, a second housing, and a rotor assembly of the pump assembly taken along a line A-A of FIG. 2B according to an example implementation of the present disclosure.

FIG. 4B depicts a perspective sectional view of a first housing 120, a second housing 126, and a rotor assembly 122 of the pump assembly, for example, the axial flow pump assembly 110A taken along a line A-A of FIG. 2B. As discussed in the example of FIGS. 2A, 2B, 3B, 3C, 3D the first housing 120 includes a first bore 144 extending between an inlet 146 and an exit 148 of the first bore 144. The first housing 120 further includes a first coupler 230 disposed proximate to the inlet 146 of the first housing 120. Further, the first housing 120 includes a plurality of first IGVs 200. In some examples, the plurality of first IGVs 200 is coupled to an inner surface 234 of the first housing 120 and the first coupler 230. The first coupler 230 includes a first receptor 232 facing the exit 148 of the first housing 120.

The second housing 126 includes a second bore 180 extending between an entrance 182 and an outlet 184 of the second bore 180. The second housing 126 further includes a second coupler 240 disposed proximate to the entrance 182 of the second housing 126. In some examples, the second coupler 240 includes a second receptor 244 facing the entrance 182, and a third receptor 246 facing the outlet 184 of the second housing 126. Further, the second housing 126 includes a plurality of first OGVs 202. In some examples, the plurality of first OGVs 202 is coupled to an inner surface 242 of the second housing 126 and the second coupler 240. In one or more examples, the second housing 126 is coupled to the first housing 120 such that the first and the second bores 144, 180 respectively are in fluid communication with one another.

The rotor assembly 122 includes an impeller 154 and a shaft 156. In some examples, the impeller 154 has a hub 154A and a plurality of blades 154B disposed over the hub 154A. The impeller 154 is disposed within the first bore 144 and rotatably coupled to the first and second receptors 232, 244 respectively via the shaft 156. It may be noted herein that the first and second receptors 232, 244 respectively, may hold the first and second bearings 158A, 158B respectively (as shown in FIG. 2A). In such examples, each end of the shaft 156 extends through the first and second bearings 158A, 158B, so as to allow the impeller 154 to rotate about the longitudinal direction 168. As discussed hereinabove, the impeller 154 rotates about the longitudinal direction 168, thereby causing the blades 154B to displace the cooling fluid 114A, generate a pressurized fluid 114B, and pump the pressurized fluid 114B through the first bore 144.

Figure 4C:
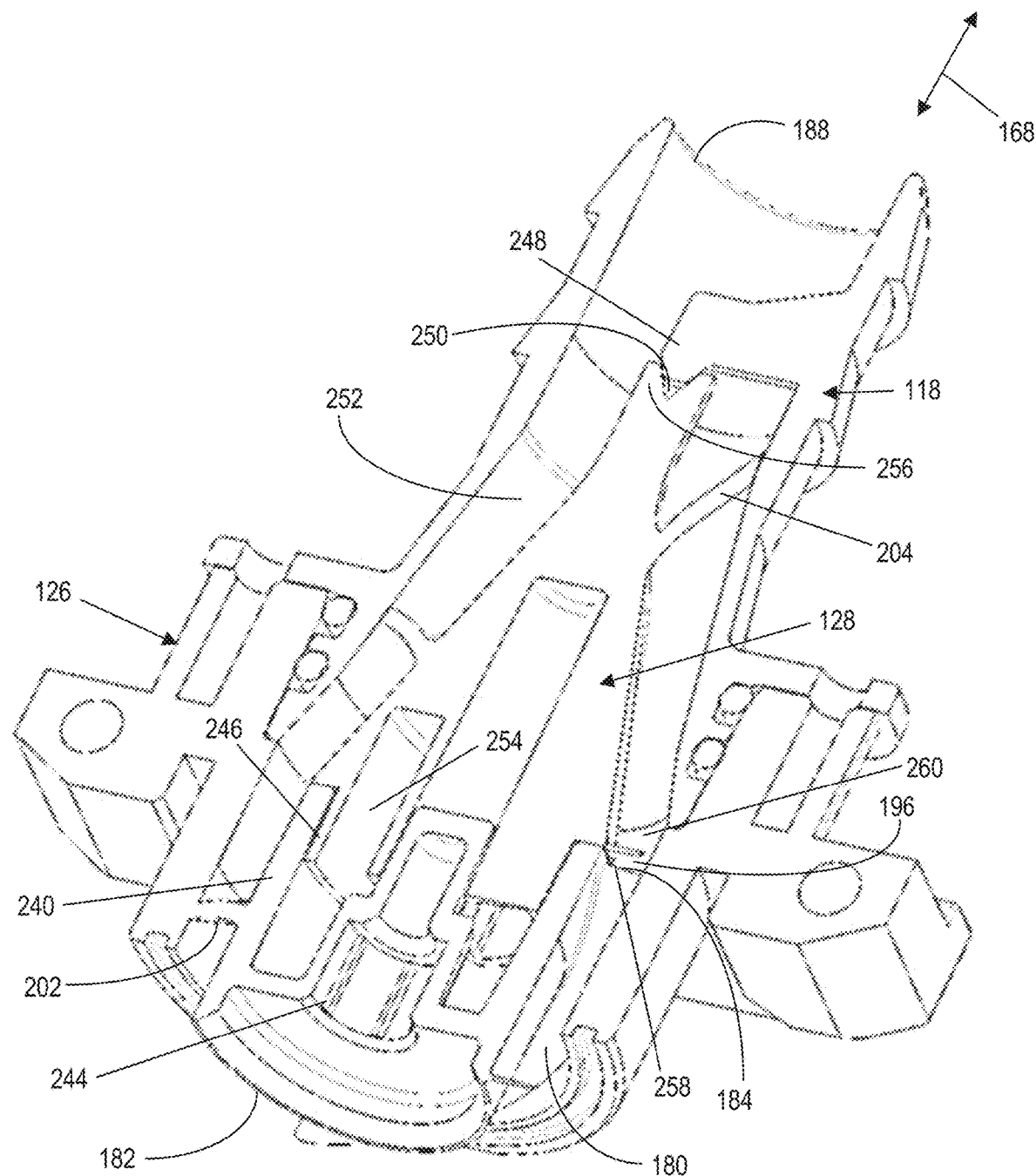
FIG. 4C illustrates a perspective sectional view of a second housing, a guide vane insert, and an outlet connection port of the pump assembly taken along a line A-A of FIG. 2B according to an example implementation of the present disclosure.

FIG. 4C depicts a perspective sectional view of a second housing 126, a guide vane insert 128, and an outlet connection port 118 of the pump assembly, for example, the axial flow pump assembly 110A taken along a line A-A of FIG. 2B. As discussed in the example of FIGS. 2A, 2B, 3D, 3E, 3F, the second housing 126 includes a second bore 180 extending between an entrance 182 and an outlet 184 of the second bore 180. The second housing includes a second coupler 240 disposed proximate to an entrance 182 of the second hosing 126. The second coupler 240 includes a second receptor 244 facing the entrance 182, and a third receptor 246 facing the outlet 184 of the second housing 126.

The outlet connection port 118 is a hollow cylindrical component having an entry 196 and an exit 188. The entry 196 of the outlet connection port 118 is coupled to the outlet 184 of the second housing 126. The outlet connection port 118 further includes a third coupler 248 disposed proximate to the exit 188 of the outlet connection port 118. The third coupler 248 includes a fourth receptor 250 facing the entry 196 of the outlet connection port 118.

The guide vane insert 128 includes a plurality of second OGVs 204 disposed within the outlet connection port 118 and fluidically coupled to an outlet 184 of the second bore 180. For example, the guide vane insert 128 is disposed within a hollow cavity 252 of the outlet connection port 118 and coupled to the third and fourth receptors 246, 250 respectively. In some examples, the guide vane insert 118 may have a plurality of first connectors 254 coupled to the third receptor 246 and a second connector 256 coupled to the fourth receptor 250.

The plurality of first and second OGVs 202, 204 respectively may de-swirl the flow of a pressurized fluid 114B exiting the outlet connection port 118. For example, a trailing edge 258 of each first OGV 202 is aligned to a leading edge 260 of a corresponding second OGV 204 to streamline the flow of the pressurized fluid 114b there between and reduce the formation of vortices.

FIG. 5 depicts a perspective view of a pump assembly, for example, an axial flow pump assembly 110A in operation. It may be noted herein that the example of FIG. 5 illustrates only a plurality of first and second IGVs 198, 200, a plurality of blades 154 of an impeller 154, and the plurality of first and second OGVs 202, 204. The various other components of the axial flow pump assembly 110A are not shown for ease of illustration of a flow of the cooling fluid 114, and such an illustration should not be construed as a limitation of the present disclosure.

The cooling fluid 114 enters the axial flow pump assembly 110A via an entry 132 of an inlet connection port. The plurality of second IGVs 198 straightens the flow of cooling fluid 114A along a longitudinal direction 168 and directs the flow of the straightened cooling fluid 114A towards the plurality of first IGVs 200. The plurality of first IGVs 200 may pre-swirl the straightened cooling fluid 114A and direct the pre-swirled cooling fluid 114A to the plurality of blades 154b of the impeller. The plurality of first and second IGVs 198, 200 may streamline the flow of the cooling fluid 114A so as to reduce pressure drops of the cooling fluid 114A, which may have otherwise occurred/caused due to disarray of the flow of the cooling fluid 114A been directed to the impeller.

In some examples, the impeller rotates about the longitudinal direction 168, thus causing the plurality of blades 154B to further displace the pre-swirled cooling fluid 114A and generate a pressurized cooling fluid 114B. Further, the plurality of blades 154B may move or pump the pressurized fluid 114B towards the plurality of first OGVs 202. In such examples, the plurality of first IGVs 202 may de-swirl the pressurized cooling fluid 114b and direct the de-swirled pressurized cooling fluid 114b towards the plurality of second OGVs 204. In such examples, the plurality of second IGVs 204 may further de-swirl the pressurized cooling fluid 114B. The plurality of first and second OGVs 202, 204 may streamline the flow of the pressurized fluid 114B so as to reduce the formation of vortices, which may have otherwise occurred due to the due to disarray of the flow of the pressurized cooling fluid 114A discharged from the impeller.

The plurality of first and second IGVs 198, 200, and the plurality of first and second OGVs 202, 204 may streamline the flow of the cooling fluid and the pressurized fluid 114A, 114B respectively, so as to improve the fluid pumping efficiency or performance of the axial flow pump assembly 110A.

FIG. 6 is a flowchart depicting a method 600 of pumping a cooling fluid with a pump assembly. It should be noted herein that the method 600 is described in conjunction with FIGS. 2A and 2B.

The method 600 starts at block 602 and continues to block 604. At block 604, the method 600 includes guiding a flow of the cooling fluid from an inlet to an impeller of a rotor assembly via a plurality of first inlet guide vanes (IGVs). In some examples, the cooling fluid is first straightened by a plurality of second IGVs and directed to the plurality of second IGVs. In such examples, the plurality of second IGVs may introduce a pre-swirl to the flow of the cooling fluid and direct the pre-swirling cooling fluid to an impeller of the pump assembly.

Further, the method 600 continues to block 606. At block 606, the method 600 imparting a varying magnetic field produced by a coil to drive the impeller to rotate about a longitudinal direction for generating a pressurized cooling fluid to pump through a first bore. For example, a plurality of blades of the impeller may further displace the pre-swirling cooling fluid to generate the pressurized cooling fluid and pump the pressurized cooling fluid through the first bore. The 600 further continues at block 608.

At block 608, the method 600 includes guiding a flow of the pressurized fluid from the first bore to a second bore via a plurality of first outlet guide vanes (OGVs). In some examples, the plurality of first OGVs may de-swirl the pressurized cooling fluid. The method 600 continues to block 610.

At block 610, the method 600 includes directing the flow of the pressurized fluid from the second bore to an exit of an outlet connection port via a plurality of second OGVs. In such examples, the plurality of second OGVs may further de-swirl the pressurized cooling fluid before the pressurized fluid exits the outlet connection port. In such examples, the pump assembly includes a guide vane insert having the plurality of second OGVs, disposed within the outlet connection port and fluidically coupled to an outlet of the second bore. In one or more examples, the plurality of first and second IGVs and the plurality of first and second OGVs may streamline the flow of the cooling fluid and the pressurized fluid respectively, so as to improve fluid pumping efficiency or performance of the pump assembly. The method 600 ends at block 612.

Various features as illustrated in the examples described herein may be implemented in apparatus, such as a rack of servers, a server of the rack, or a hybrid electric vehicle for removing waste-heat from a waste heat producing system, for example, a processor-based system or a battery pack. In one or more examples, a plurality of guide vanes may be disposed within a hose connection port (e.g., inlet connection port and/or outlet connection port), thus allowing the pump assembly to occupy less space within the waste-heat producing system, and have small footprint in the apparatus, while simultaneously improving the fluid pumping efficiency or performance of the pump assembly.

In the foregoing description, numerous details are set forth to provide an understanding of the subject matter disclosed herein. However, implementation may be practiced without some or all of these details. Other implementations may include modifications, combinations, and variations from the details discussed above. It is intended that the following claims cover such modifications and variations.

What is claimed is:
1. A pump assembly comprising:
a first housing having a first bore and a plurality of first inlet guide vanes (IGVs) coupled to an inlet of the first bore, to pre-swirl a flow of a fluid;
a rotor assembly disposed in the first bore and comprising an impeller to rotate to pump the fluid through the first bore;
a stator assembly mounted around a portion of the first housing and comprising a coil adapted to impart a varying magnetic field through the first housing to drive the impeller to rotate about a longitudinal direction;

a second housing having a second bore fluidically coupled to the first bore, and a plurality of first outlet guide vanes (OGVs) coupled at an entrance of the second bore;

an outlet connection port coupled to the second housing; and a guide vane insert comprising a plurality of second OGVs, disposed within the outlet connection port and fluidically coupled to an outlet of the second bore, wherein the plurality of first and second OGVs de-swirl the flow of the fluid exiting the outlet connection port.

2. The pump assembly of claim 1, further comprising an inlet connection port coupled to the first housing, wherein the inlet connection port comprises a plurality of second IGVs coupled proximate to an exit of the inlet connection port.

3. The pump assembly of claim 2, wherein each of the plurality of second IGVs is oriented substantially parallel to the longitudinal direction.

4. The pump assembly of claim 2, wherein each second IGV straightens the flow of fluid along the longitudinal direction and directs the flow of the fluid towards a corresponding first IGV, and wherein a trailing edge of each second IGV is aligned to a leading edge of a corresponding first IGV to streamline the flow of the fluid there between.

5. The pump assembly of claim 2, wherein the inlet connection port is manufactured using one or more of a machining technique, an injection molding technique, or a 3D printing technique.

6. The pump assembly of claim 1, wherein a trailing edge of each first OGV is aligned to a leading edge of a corresponding second OGV to streamline the flow of a pressurized fluid there between and reduce the formation of vortices.

7. The pump assembly of claim 1, wherein the first housing comprises a first coupler having a first receptor disposed proximate to the inlet, wherein the plurality of first IGVs is coupled to the first coupler and an inner surface of the first housing.

8. The pump assembly of claim 7, wherein the second housing comprises a second coupler disposed proximate to the entrance, wherein the plurality of first OGVs is coupled to the second coupler and an inner surface of the second housing, and wherein the second coupler comprises a second receptor facing the entrance and a third receptor facing the outlet.

9. The pump assembly of claim 8, wherein the impeller is rotatably coupled to the first and second receptors via a shaft.

10. The pump assembly of claim 8, wherein the outlet connection port comprises a third coupler having a fourth receptor, disposed proximate to an exit of the outlet connection port, wherein the guide vane insert is coupled to the third and fourth receptors.

11. The pump assembly of claim 1, wherein the outlet connection port and the guide vane insert are coupled to one another to form a unitary component comprising the plurality of second OGVs.

12. The pump assembly of claim 11, wherein the unitary component is manufactured using one or more of a machining technique, an injection molding technique, or a 3D printing technique.

13. The pump assembly of claim 1, wherein each of the outlet connection port and the guide vane insert are manufactured separately using one or more of a machining technique, an injection molding technique, or a 3D printing technique.

14. An apparatus comprising:

a waste-heat producing system; and a pump assembly to pump a fluid to transfer thermal energy from the waste-heat producing system, wherein the pump assembly comprises:

a first housing having a first bore and a plurality of first inlet guide vanes (IGVs) coupled to an inlet of the first bore, to pre-swirl a flow of the fluid;

a rotor assembly disposed in the first bore and comprising an impeller to rotate to pump the fluid through the first bore;

a stator assembly mounted around a portion of the first housing and comprising a coil adapted to impart a varying magnetic field through the portion to drive the impeller to rotate about a longitudinal direction;

a second housing having a second bore fluidically coupled to the first bore, and a plurality of first outlet guide vanes (OGVs) coupled at an entrance of the second bore;

an outlet connection port coupled to the second housing; and a guide vane insert comprising a plurality of second OGVs, disposed within the outlet connection port and fluidically coupled to an outlet of the second bore, wherein the plurality of first and second OGVs de-swirl the flow of the fluid exiting the outlet connection port.

15. The apparatus of claim 14, wherein the waste-heat producing system comprises a processor-based system, wherein the processor-based system comprises a circuit board comprising at least one electronic device, and wherein the pump assembly pumps the fluid to transfer the thermal energy from the at least one electronic device.

16. The apparatus of claim 14, wherein the pump assembly further comprises an inlet connection port coupled to the first housing, wherein the inlet connection port comprises a plurality of second IGVs coupled proximate to an exit of the inlet connection port and fluidically coupled to the inlet, and wherein each of the plurality of second IGVs is oriented substantially parallel to the longitudinal direction.

17. The apparatus of claim 16, wherein each second IGV straightens the flow of fluid along the longitudinal direction and directs the flow of the fluid towards a corresponding first IGV, and wherein a trailing edge of each second IGV is aligned to a leading edge of the corresponding first IGV to streamline the flow of the fluid there between.

18. The apparatus of claim 14, wherein a trailing edge of each first OGV is aligned to a leading edge of a corresponding second OGV to streamline the flow of a pressurized fluid there between and reduce the formation of vortices.

19. A method of pumping a fluid with a pump assembly, comprising:

guiding a flow of the fluid from an inlet to an impeller of a rotor assembly via a plurality of first inlet guide vanes (IGVs), wherein guiding the flow of the fluid comprises introducing a pre-swirl to the flow of the fluid directed to the impeller;

imparting a varying magnetic field produced by a coil to drive the impeller to rotate about a longitudinal direction for generating a pressurized fluid and to pump it through a first bore;

guiding a flow of the pressurized fluid from the first bore to a second bore via a plurality of first outlet guide vanes (OGVs); and directing the flow of the pressurized fluid from the second bore to an exit of an outlet connection port via a plurality of second OGVs, wherein guiding and directing the flow of the pressurized fluid via the plurality of first and second OGVs respectively, comprise de-swirling the flow of the pressurized fluid exiting the outlet connection port, wherein the pump assembly comprises a guide vane insert comprising the plurality of second OGVs, disposed within the outlet connection port and fluidically coupled to an outlet of the second bore.

20. The method of claim 19, further comprising straightening the flow of the fluid via a plurality of second IGVs and directing the flow of the fluid to the plurality of the first IGVs at the inlet, wherein the plurality of second IGVs is coupled proximate to an exit of the inlet connection port and fluidically coupled to the inlet of the first bore.

* * * * *